(12) United States Patent
Steinkopff

(10) Patent No.: US 6,462,462 B2
(45) Date of Patent: *Oct. 8, 2002

(54) NON-LINE PIEZOELECTRIC MATERIAL AND METHOD FOR DETERMINING A DISTRIBUTION OF CHARACTERISTIC MODULI

(75) Inventor: Thorsten Steinkopff, Eglharting (DE)

(73) Assignee: Siemens Aktiengesellschaft AG, Munich (DE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/265,095

(22) Filed: Mar. 9, 1999

(65) Prior Publication Data

US 2002/0000762 A1 Jan. 3, 2002

(30) Foreign Application Priority Data

Mar. 9, 1998 (DE) .......................................... 198 10 056

(51) Int. Cl.$^7$ ............................................... H01L 41/04
(52) U.S. Cl. ....................................................... 310/328
(58) Field of Search ........................................ 310/328

(56) References Cited

PUBLICATIONS

Pak, "Linear electro-elastic fracture mechanics of piezoelectric materials", International Journal of Fracture 54: pp. 79–100.
ANSYS User's Manual for Revision 5.0, vol. I Procedures, pp. 8–1–8–13.
Takahashi et al., "Internal Electrode Piezoelectric Ceramic Actuator", Proceedings of the 4$^{th}$ Meeting on Ferroelectric Materials and Their Applications, 1983, pp. 157–159.

*Primary Examiner*—Nestor Ramirez
*Assistant Examiner*—Peter Medley
(74) *Attorney, Agent, or Firm*—BakerBotts LLP

(57) ABSTRACT

A product comprised of a non-linear piezoelectric materia, in which a plurality of reference points are defined. The product is exposed to a distribution of an electrical field and is characterized by a distribution of characteristic linear moduli over the reference points, whereby each modulus is determined as an increase in a secant reaching, in an associated characteristic curve, from a zero point up to a point corresponding to the reference point. The characteristic curve is projected from a system of characteristic curves that describes relations between the electrical field and loadings characteristic of additional state quantities in the material. In addition, the invention relates to a method for determining a corresponding distribution of characteristic moduli in a corresponding product.

8 Claims, 3 Drawing Sheets

$T=T_0$

NON-LINE PIEZOELECTRIC MATERIAL AND METHOD FOR DETERMINING A DISTRIBUTION OF CHARACTERISTIC MODULI

BACKGROUND OF THE INVENTION

1. Field of the Invention

The present invention relates to a product made of a non-linear piezoelectric material in which a plurality of reference points are defined and which can be exposed to a distribution of an electrical field. Moreover, the invention relates to a method for determining a distribution of characteristic moduli in such a product.

The present invention relates in particular to a product that is to be used as a piezoelectric actuator or piezoelectric drive element. Such a product may be used as a driving component of an injection valve for supplying fuel to an internal-combustion engine. An injection valve of this sort is of particular interest in what is known as a "common rail" injection apparatus for an internal-combustion engine. In this injection apparatus, there is a reservoir, commonly called a "common rail," in which the fuel is provided under high pressure. Several injection valves are connected to the reservoir, through which valves the fuel reaches the internal-combustion engine.

2. Description of Related Art

A material that may be used for such an application is a ceramic made of a mixed oxide containing lead, zirconium and titanium, known under the designation "PZT." This typically polycrystalline-textured material exhibits a significant non-linear characteristic with respect to its electrical and mechanical characteristics. This is especially true when the electrical field strength to which the material is exposed exceeds 1 kV/mm, or the mechanical tension to which the material is exposed exceeds 25 MPa. This characteristic is due to the fact that under a corresponding stress the material exhibits ferroelectricity and ferroelasticity, in addition to piezoelectricity. Ferroelectricity and ferroelasticity are both characterized by marked non-linearity and also hysteresis. Microscopically, ferroelectricity or, respectively, ferroelasticity are expressed in that regions of uniform polarization or uniform expansion form in the material, called domains. Changes in the stress have the effect that these domains become larger or smaller. Polarization and expansion in such domains are both strongly anisotropic and also strongly coupled with one another, in a way that differs from the conventional linear piezoelectric effect observed in a monocrystal comprising a single domain.

An essential step in the manufacture of a product from a non-linear piezoelectric material is what is called polarization, in which the product is exposed for the first time to an electrical field. This leads to a distribution of a lasting polarization in the material and first gives rise to its piezoelectric characteristic. For this purpose, the product is exposed to an electrical field with a field strength of, typically approx. 2 kV/mm. This results in an expansion of the product in the direction of the electrical field of, typically 0.3%. Regarded microscopically, the polarization has the effect of orienting the domains in the product, and is essentially determined by the mobility of the surfaces that divide adjacent domains from one another, called "walls." The behavior of the product in the context of later operation for its intended purpose is also essentially influenced by the mobility of the walls. An expansion of such a product typically required during operation is on the order of magnitude of 0.15%. If the product is non-homogenously structured, e.g. as a stack with internal electrodes which each traverse the product only incompletely, then as a rule no homogenous polarization of the material in the product is achieved. Regions of the product that are not exposed to the electrical field during polarization, or are exposed only partially (non-active regions), are then subject to mechanical tensile stress if the regions of the product that are exposed to the electrical field (active regions) lengthen under the effect of the electrical field. In some circumstances, this can lead to cracks in the material. If such cracks arise during polarization, they are typically called "polarization cracks." Such polarization cracks can grow during the later operation of the product, in particular when fatigue phenomena of the material occur. Additional cracks can also occur during operation.

In order to enable construction of a product of the type named above with assurance of suitable operational reliability, it is necessary to be able to describe the behavior of the product under the expected electrical and mechanical loadings. A corresponding description is also useful as an instrument for quality assurance and quality control, as well as for proof of operation, as required by corresponding standards (ISO-9000). The description can also be a valuable means for meeting the information requirements of the automobile industry regarding design, function and quality of products to be supplied.

Previously known methods for describing a product made of a piezoelectric material are limited to conditions in which a linear characteristic of the material and a piezoelectric effect not influenced by ferroelectricity and ferroelasticity can be assumed. Such a method is for example available in the context of the software package ANSYS, which uses finite element analysis; see "ANSYS Users Manual for Revision 5.0," vol. 1, Swanson, Analysis Systems, Inc., Houston, Pennsylvania, 1992. Of particular interest in this publication is chapter 8, "Coupled-Field Analysis," pp. 8–1 ff. The treatment of the piezoelectric effect is explained in the section "Piezoelectric Analysis," pages 8–11 to 8–13.

A product made of a piezoelectric material with internal electrodes is found in the article "Internal Electrode Ceramic Actuator," Jap. Journal of Applied Physics 22 (1983) 157. This article also mentions the possibility for taking into account the tensile stress that may occur in the product, in order to ensure a sufficient operational reliability of the product. A method for investigating a linear piezoelectric material with the methods of linear electroelastic fracture mechanics can be found in an article by Y. E. Pak, International Journal of Fracture 54 (1992) 79. This method makes it possible to describe the environment of a crack in a linear piezoelectric material. DE 44 26 814 C1 describes an arrangement for dynamic force-path measurement that can be used to carry out measurements in a product of the type presently under consideration.

SUMMARY OF THE INVENTION

One object of the invention is to characterize a piezoelectric product in such a way that a determination of the loading of the product to be expected under a given stress is possible. Both a correspondingly characterized product and a method for characterization of a product are provided.

With respect to the product, a non-linear piezoelectric material in which a multiplicity of reference points is defined and which can be exposed to a distribution of an electrical field. A distribution of characteristic linear moduli is allocated to this product, whereby each linear modulus is determined for each reference point as an increase in a secant reaching, in an associated characteristic curve, from a zero point to a point corresponding to the reference point. The characteristic curve is projected from a system of characteristic curves that describes relations between the electrical field and further state variables in the material.

The method, for determination of a distribution of characteristic linear moduli in a product made of a non-linear piezoelectric material, in which a multiplicity of reference points is defined and which is exposed to a distribution of an electrical field, comprises: determining a system of characteristic curves that describe relations between the electrical field and further state variables in the material; for each modulus, projecting an associated characteristic curve from the system of characteristic curves; at each reference point, determining each modulus as an increase of a secant reaching from a zero point of the associated characteristic curve to a point of the characteristic curve corresponding to the reference point.

According to the invention, a product made of a non-linear piezoelectric material is modeled (under the assumption that it is exposed to a predetermined distribution of an electrical field) as a non-homogenously structured product made of a material that behaves in linear fashion. At each reference point, the state variables that prevail under the predetermined electrical field are determined, and the further modelling assumption is made that these state variables are achieved in the context of linear processes. Such a linear process is described by a secant in the associated characteristic curve. A distribution of characteristic linear moduli in the product is thus indicated that correctly describes the non-linear piezoelectric behavior, and, if necessary, the ferroelectrically modified or ferroelastically modified behavior of the product. This distribution can be used as input for a conventional linear computing method, as contained in the cited software packet ANSYS, in order to determine the behavior of the product under the loading of the electrical field, as well as under additional loads that may be present. This also accurately describes the distribution of mechanical stress in the product.

Each characteristic linear modulus is determined as an increase of a secant that reaches, in an associated characteristic curve, from a zero point to a point of the characteristic curve that corresponds to the reference point under consideration. The point of the characteristic curve that corresponds to the reference point is the point of the characteristic curve that corresponds to the electrical field or, respectively, to another decisive state variable determined previously for the reference point under consideration. The characteristic linear modulus thus reproduces the relations at the reference point in largely correct fashion, as long as these relations do not change too drastically due to an expansion or mechanical tension not taken into account up to that point. It can thus be assumed that the linear model used in the context of the invention describes the product primarily correctly.

The further state variables that are decisive in the product or for the execution of the method are preferably specified as expansion, mechanical tension and polarization. These three named state variables form, with the predetermined electrical field, a set of state variables that completely determines the piezoelectric, ferroelectric and ferroelastic properties of the material. In this connection, the characteristic linear moduli are selected, with additional preference, in such a way that they describe a linearized relation between the electrical field and expansion at a predetermined mechanical tension, between the electrical field and polarization at a predetermined mechanical tension, or between expansion and mechanical tension for a predetermined electrical field. This selection largely corresponds to standard practice in the context of the standard description of piezoelectricity.

In the context of a development, in the product a first region is provided in which the electrical field is significantly different than zero, as well as a second region in which the electrical field is essentially equal to zero. The mechanical tension in the product is assumed equal to zero at each reference point in the first region. Such a product is for example a piezoelectric actuator with internal electrodes that do not entirely traverse the product. In such an actuator, there is normally no homogenous polarization of the piezoelectric material during the polarization, and there remains at least one piezoelectrically inactive region. If the product is exposed to an electrical field, be it the electrical field required for the polarization or an electrical field during its operation for its intended purpose, then each piezoelectrically active region of the product will expand without essential mechanical tensions occurring within this region. A piezoelectrically inactive region is not influenced by the electrical field, but experiences mechanical tension, including mechanical tensile stress, due to the deformation of the product by means of the piezoelectrically caused expansion in the piezoelectrically active region. In this situation, it is possible and useful to assume an imperceptible mechanical tension in each piezoelectrically active region, and such a region is regularly distinguished in that the electrical field therein is significantly different from zero. Mechanical tension differing significantly from zero occurs only where there is no polarization of the material, i.e. where there is no electrical field strength differing significantly from zero. The corresponding division significantly facilitates the characterization of the product, because it makes it possible to begin from the alternative that at an observed reference point there is either an electrical field differing from zero, with imperceptible mechanical tension, or an imperceptible electrical field with mechanical tension differing from zero.

The electrical field that loads the product is used with particular preference as the field that is required for the polarization of the product. In the loading of the product with this field, there typically occurs a maximal mechanical stress. This case is thus of particular interest for the construction of a corresponding product that is well-suited to practical demands.

It goes without saying that the above considerations relating to advantageous developments of the product or of the method can be applied analogously to a situation in which the product is subjected to an additional mechanical tension in addition to the electrical field. This situation is for example given when the product is subjected to an additional compressing mechanical tension for the purpose of polarization. This additional mechanical tension serves in particular for the prevention of an undesirably high expansion during the polarization. The product is in particular a piezoelectric actuator, as already indicated.

In addition, the product preferably comprises electrodes by means of which it can be exposed to the electrical field. Such electrodes are typically made of metal and are not piezoelectric. There are no objections in principle to the inclusion of the electrodes in a computing method, e.g. according to the method of finite elements, for the determination of the behavior of the product under a specific load.

It is particularly preferable to dimension the electrical field to which the product is to be exposed in such a way that it corresponds to a maximum loading of the product. In this way, the distribution of the mechanical loadings in the interior of the product can be determined in the context of the calculation of the behavior of the product, and the recognition of a particularly highly loaded region in the product is reliably possible.

The method, in the sense of the above statements, is particularly preferably supplemented in that, after the determination of the distribution of the moduli, a calculation of the state variables in the material at the reference points takes place by means of a linear model, using the moduli. This linear model is in particular a model in the sense of the method of finite elements, as mentioned.

DETAILED DESCRIPTION OF THE PREFERRED EMBODIMENTS

Figure 1:
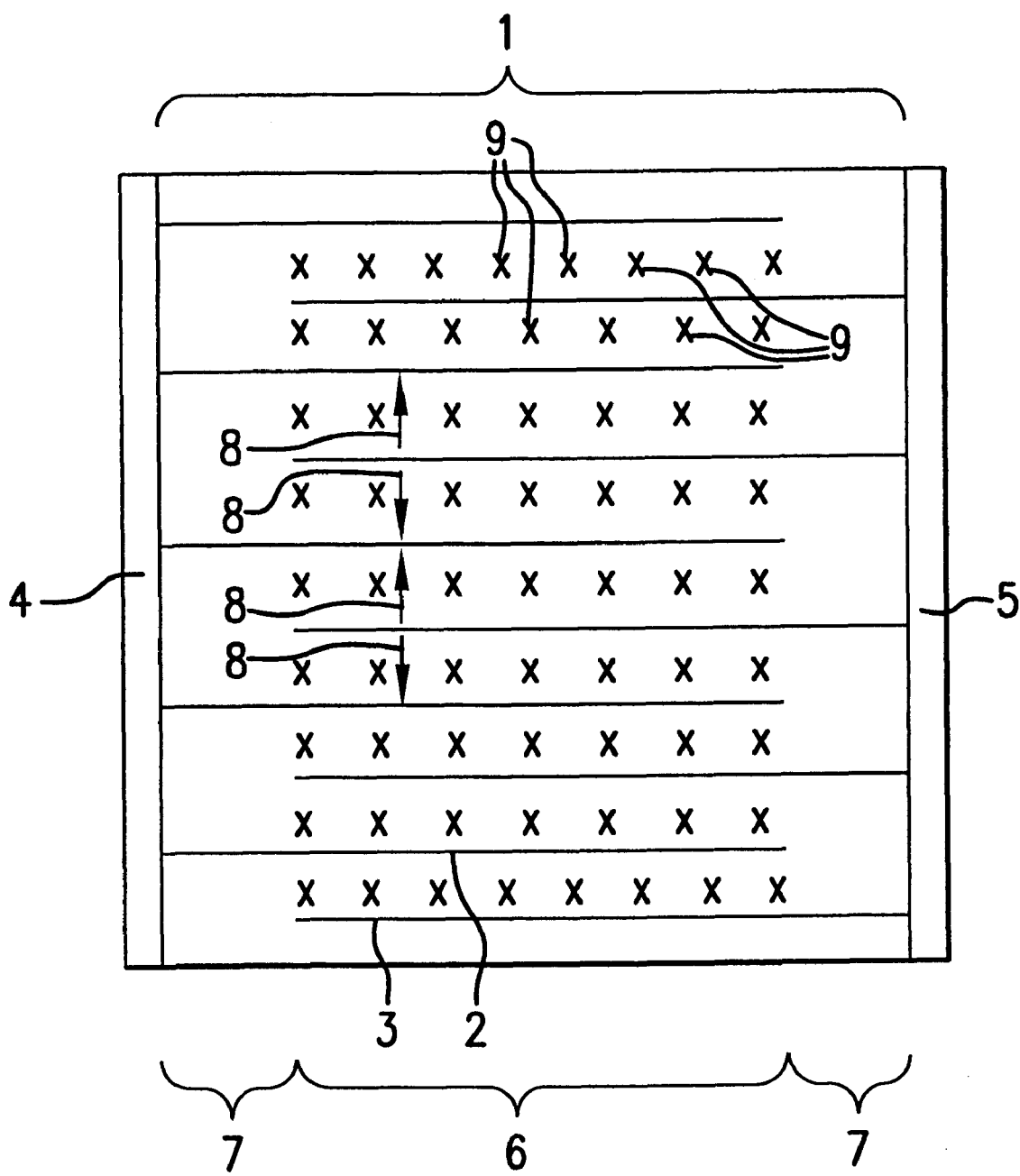
FIG. 1 illustrates a section through a product made of a non-linear piezoelectric material.

FIG. 1 shows a piezoelectric actuator comprising a non-linear piezoelectric material 1. First internal electrodes 2 and second internal electrodes 3, respectively made of a material with good conductivity, are embedded in the material 1 in alternating fashion. All first internal electrodes 2 are contacted to a first external electrode 4. Likewise, all second internal electrodes 3 are contacted to a single second external electrode 5. For the operation of the actuator, an electrical voltage is applied between the first external electrode 4 and the second external electrode 5. The voltage is carried into the material 1 via the internal electrodes 2 and 3.

A first or active region 6 in the actuator is defined by that region in which first internal electrodes 2 and second internal electrodes 3 are arranged one over the other in alternating fashion. The active region 6 is adjoined by two second or inactive regions 7 that are connected directly to, respectively, one external electrode 4 or 5, and in which there are, respectively, only first internal electrodes 2 or second internal electrodes 3. In the active region 6, there arises, due to the applied electrical voltage, an electrical field 8 whose distribution is indicated by arrows. This electrical field 8 is used in order to give rise to the piezoelectric effect in the actuator. In no inactive region 7 is there an electrical field of any significant magnitude, except for possible boundary effects at the transition between the inactive region 7 and the active region 6.

As long as the electrical field 8 remains sufficiently small, the piezoelectric effect exhibits a linear characteristic. Under the presupposition that the actuator is mechanically completely relieved of stress, i.e. is exposed to no mechanical tension, there results a linear dependency between the strength of the electrical field 8 and the magnitude of the expansion of the material 1 caused thereby. However, if, as is decisive in the present case, the electrical field 8 exceeds a certain strength, which is to be expected given an application of the actuator in an injection valve for a diesel motor, the piezoelectric effect exhibits a pronounced non-linear characteristic, and even exhibits hysteresis. In addition, ferroelectricity and ferroelasticity occur in the material 1.

Such behavior of the material 1, or, respectively, of a product formed therefrom, is, as a rule, no longer capable of being treated in the context of a closed theory, but rather requires the use of a numerical method. The method of finite elements is particularly suitable. This requires the provision of a multiplicity of reference points 9, more or less uniformly distributed, in the material under consideration, and requires the modeling of the relations in the product in such a way that only the relations at the reference points 9 are considered. This method is ideally suited for realization on a program-controlled computer. It is widely used in this technology and requires no detailed explanation here. Only a few such reference points 9 are shown in FIG. 1, in order to ensure the informativeness of the Figure.

Figure 2:
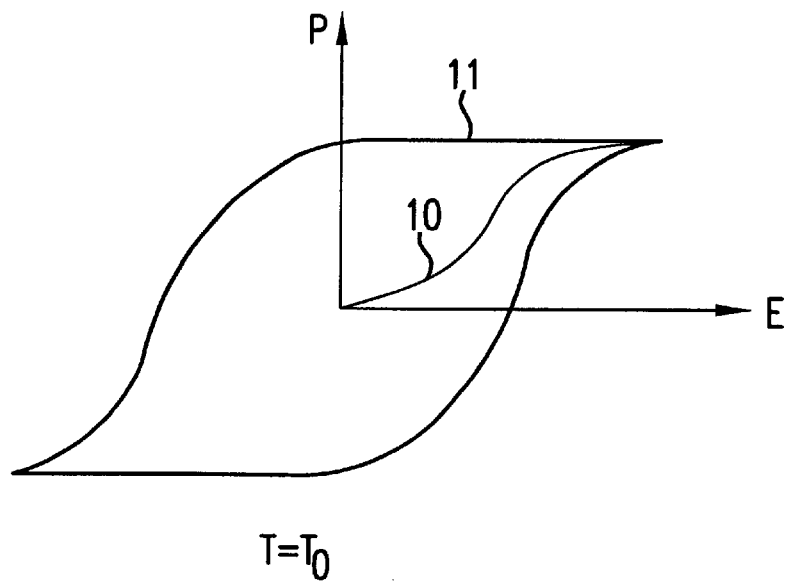
FIG. 2 illustrates a characteristic curve that represents relations between characteristic loadings of a non-linear piezoelectric material.
Figure 3:
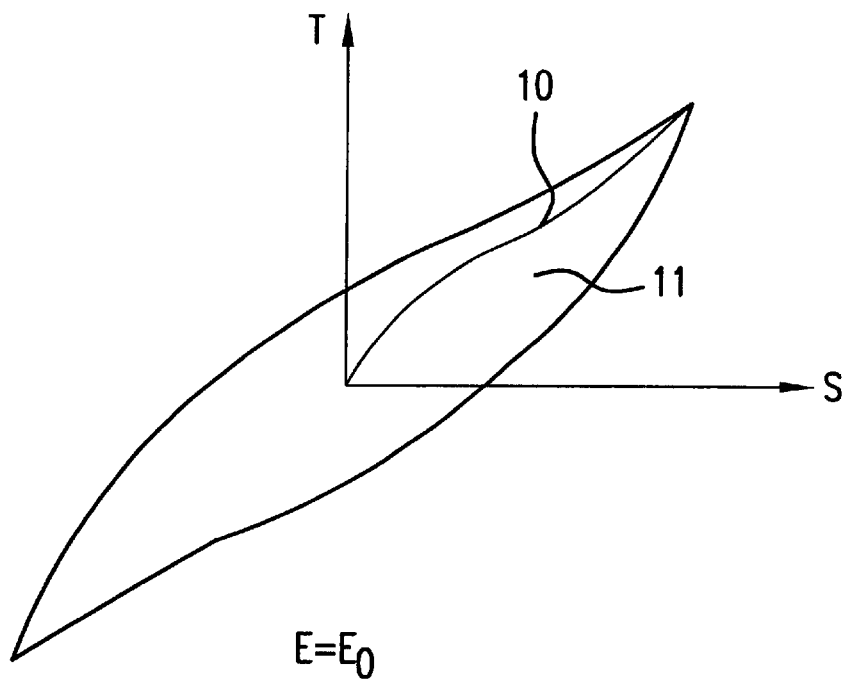
FIG. 3 illustrates a characteristic curve that represents relations between characteristic loadings of a non-linear piezoelectric material.
Figure 4:
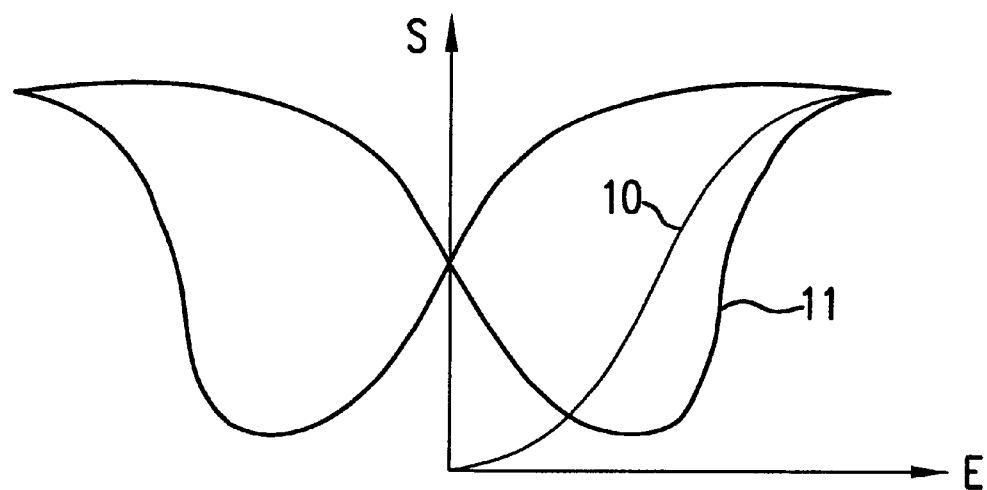
FIG. 4 illustrates a characteristic curve that represents relations between characteristic loadings of a non-linear piezoelectric material.

FIGS. 2, 3 and 4 show how the variables electrical field E, polarization P, mechanical tension T, and expansion S, which describe the corresponding product, are related to one another.

FIG. 2 shows a characteristic curve of the dependence of the polarization P on the electrical field E. The polarization P thereby refers to a degree of an orientation of elementary electrical dipoles in the material 1. The electrical dipoles result due to a non-homogenous charge distribution within the crystal structure of the material 1. The dependence of the polarization P on the electrical field E is relatively complex.

Based on a non-polarized material, exposed to no electrical field E, given an enlargement of the electrical field E there first results a dependency according to what is called a new curve 10. This is sometimes also called an initial magnetization curve or "virgin curve." Given a sufficiently large electrical field E, the polarization P remains essentially constant, and at first is not significantly reduced even when the electrical field E is again made smaller.

A significant change in the polarization P does not occur until the electrical field E has been repolarized and has already again achieved a considerable strength. The corresponding dependency is described by what is called a hysteresis curve 11. It goes without saying that the relation between the electrical field E and the polarization P is dependent on whether the material 1 under consideration is additionally under a mechanical tension, be it a mechanical tension due to pressure (to be assigned a positive sign) or a mechanical tension due to traction (to be assigned a negative sign). In this sense, a characteristic curve for the relation between E and P, said curve corresponding to a predetermined mechanical tension $T_0$, is to be learned from a family of characteristics that is decisive for all three parameters E, P and T. The effect shown in FIG. 2 and identified by the hysteresis shown is what is known as the "ferroelectric effect."

FIG. 3 represents a relation between expansion S and mechanical tension T for a predetermined electrical field $E_0$. Given sufficiently small expansion S, this relation corresponds to the known Hooke's Law. However, given sufficiently great expansion S this can no longer be applied, and gives way in turn to a complex relation characterized by hysteresis, as can be seen in FIG. 3. A new curve 10 and a hysteresis curve 11 are again shown. The effect shown in FIG. 3 is the "ferroelastic effect."

The microscopic interpretation of the ferroelectricity and of the ferroelasticity corresponds to the microscopic interpretation of the ferromagnetism. In the material under consideration, domains form, in each of which the observed measurement variable is constant. A macroscopically decisive value of the observed variable results from averaging over all domains to be taken into consideration. A modification of the macroscopic variable results from the enlarging or making smaller of domains. This is often graphically described in such a way that walls that separate adjacent domains from one another wander through the material.

Here it is to be assumed that ferroelectricity and ferroelasticity are strongly coupled with one another, which is expressed in that the same domains in the material are effective for both effects.

FIG. 4 shows, under the presupposition of predetermined mechanical tension $T_0$ of the material 1, the relation between the electrical field E and the expansion S, corresponding to the actual piezoelectric effect. FIG. 4 shows the marked non-linearity and hysteresis of the piezoelectric effect, taking into account a relatively large electrical field strength E. The corresponding characteristic curve shows, in turn, a new curve 10 and an hysteresis curve 11, which in this case has the shape of a butterfly.

FIGS. 2, 3 and 4 may serve as an indication that a closed theoretical treatment of a product made of a piezoelectric material 1, as shown in FIG. 1, has not succeeded up to now. Such a treatment has in particular been unsuccessful in the context of the standard finite element method, because this method can indeed describe a relatively complexly constructed product. However, it is limited to the assumption that all effects to be taken into account in the product are of a linear nature.

Figure 5:
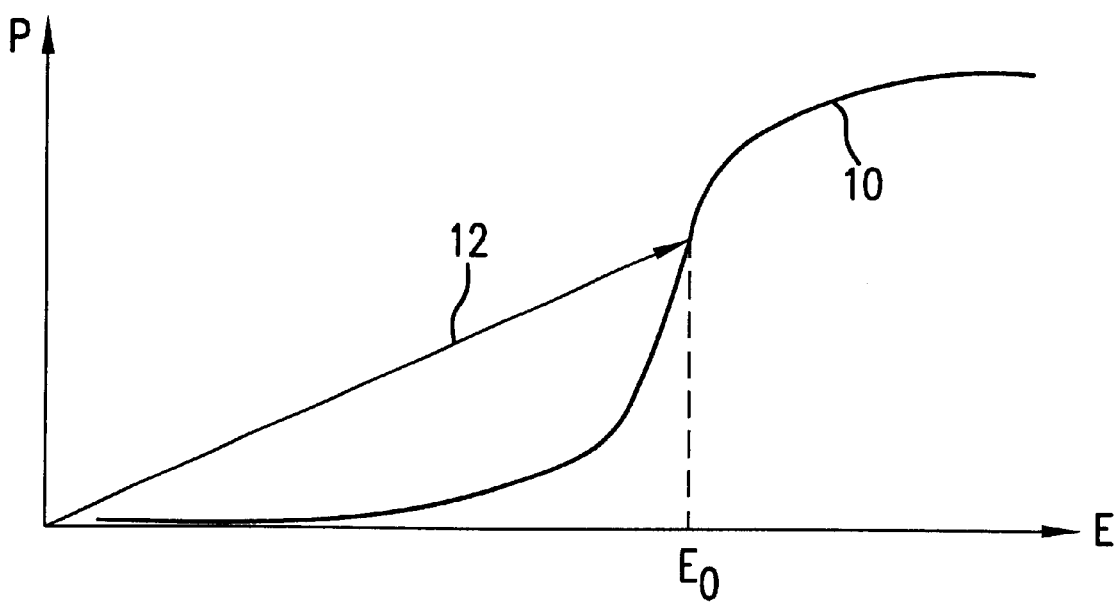
FIG. 5 illustrates a characteristic curve that represents relations between characteristic loadings of a non-linear piezoelectric material.

A characterization of the product that can be the basis for the execution of calculations in the context of the method of finite elements can however succeed under the following assumption, illustrated in FIG. 5. In the product under consideration (see FIG. 1), first the decisive electrical field 8 is determined for each reference point 9. Then, with the aid of the new curve 10 for the description of the relation between the polarization P and the electrical field E, the polarization associated with the electrical field $E_0$ prevailing at the observed reference point 9 can be determined. This is derived from the point of the new curve 10 associated with the electrical field $E_0$. Subsequently, a secant 12 is drawn from the origin of the diagram to the stated point, and an increase of the secant 12 is applied, as a characteristic linear modulus associated with the reference point 9, for the description of an assumed linear relation between the electrical field E and the polarization P. This takes place separately for each reference point 9, and an associated characteristic linear modulus is obtained in this way for each reference point 9. Further characteristic moduli are then obtained for all reference points 9 for relations between mechanical tension and expansion (see FIG. 3), and expansion S and the electrical field E (see FIG. 4). In the end, for each reference point there is a set of associated characteristic linear moduli that is suited for the correct description of the behavior of the product under loading with the predetermined electrical field. On this basis, a detailed calculation of the behavior of the product can then take place with the use of the conventional finite element method, whereby the determined characteristic linear moduli serve as input variables.

Finally, reference is made to earlier statements concerning developments of the described characterization under particular assumptions whereby the characterization can be simplified considerably. These statements are no less valid here.

The invention provides a product made of a non-linear piezoelectric material to which is assigned a particular characterization by means of characteristic linear moduli. The invention thereby makes it possible to describe the behavior of the product, under predetermined stress, with conventional means, in particular with the finite element method. In particular, in this way it is possible to verify the fulfillment by the product of predetermined loading criteria.

The present invention is subject to many variations, modifications and changes in detail. It is intended that all matter described throughout the specification and shown in the accompanying drawings be considered illustrative only. Accordingly, it is intended that the invention be limited only by the spirit and scope of the appended claims.

What is claimed is:

1. A method for determining a distribution of characteristic linear moduli in a product made of a non-linear piezoelectric material in which a plurality of reference points are defined, and which is exposed to a distribution of an electrical field, comprising the steps of:

determining a system of characteristic curves that describe relations between the electrical field and further state variables in the material; projecting, for each modulus, an associated characteristic curve from the system of characteristic curves; and defining the moduli at each reference point, for each modulus as an increase of a secant reaching from a zero point of the associated characteristic curve up to a point, corresponding to the reference point, of the characteristic curve.

2. A method according to claim 1, wherein a new curve is used for each characteristic curve.

3. A method according to claim 1, wherein the characteristic loadings are expansion, mechanical tension and polarization.

4. A method according to claim 3, wherein each modulus describes one of a linearized relation between the electrical field and expansion at a predetermined mechanical tension, between the electrical field and the polarization at a predetermined mechanical tension, and between expansion and mechanical tension for a predetermined electrical field.

5. A method according to claim 1, wherein the electrical field is determined for a situation in which the product is subjected to polarization.

6. A method according to claim 1, wherein the electrical field is determined for a situation in which the product is subjected to an additional mechanical tension.

7. A method according to claim 1, wherein the electrical field provides a maximum loading of the product.

8. A method according to claim 1, wherein according to the determination of the distribution of the moduli, a determination of the state variables in the material at the reference points takes place using a linear model, with the use of the moduli.

* * * * *